United States Patent
Calafiore et al.

(10) Patent No.: US 10,942,398 B1
(45) Date of Patent: Mar. 9, 2021

(54) CONTINUOUS LIQUID CRYSTAL ALIGNMENT PATTERNS FOR GEOMETRIC PHASE OPTICS

(71) Applicant: Facebook Technologies, LLC, Menlo Park, CA (US)

(72) Inventors: Giuseppe Calafiore, Redmond, WA (US); Wai Sze Tiffany Lam, Redmond, WA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 381 days.

(21) Appl. No.: 15/918,885

(22) Filed: Mar. 12, 2018

Related U.S. Application Data

(60) Provisional application No. 62/509,032, filed on May 19, 2017.

(51) Int. Cl.
    *G02F 1/1337* (2006.01)
    *G02F 1/1347* (2006.01)
    (Continued)

(52) U.S. Cl.
    CPC ........ *G02F 1/13378* (2013.01); *G02F 1/1347* (2013.01); *G02F 1/313* (2013.01);
    (Continued)

(58) Field of Classification Search
    CPC ... H01L 29/786; H01L 21/336; G02F 1/1337; G02F 1/13378; G02F 1/1347; G02F 1/315; G02F 1/313; G02F 2001/133769; G02F 2001/133757; G02F 2001/133776; G02F 2001/133792; G02F 2203/24; G03F 7/0002
    (Continued)

(56) References Cited

U.S. PATENT DOCUMENTS

2006/0290856 A1\* 12/2006 Lim .................. G02F 1/133788
    349/125
2010/0120251 A1\* 5/2010 Sreenivasan ........... B82Y 10/00
    438/694

(Continued)

OTHER PUBLICATIONS

Michael J. Escuti et al., Titled: "Geometric-Phase Holograms"— Feb. 2016: Optics & Photonics News, pp. 22-29, Feb. 1, 2016, 8 pages.

(Continued)

*Primary Examiner* — Charles S Chang
(74) *Attorney, Agent, or Firm* — Weaver Austin Villeneuve & Sampson LLP

(57) ABSTRACT

A layered optical element includes a substrate layer, an electrode layer disposed on the substrate layer, a liquid crystal (LC) layer comprising LC molecules, and a nanopatterned alignment layer in physical contact with the LC layer and disposed on a surface of either the substrate layer or the electrode layer. The nanopatterned alignment layer includes an arrangement of nanostructures, e.g., a grouping of nanolines. For a subset of the grouping of nanolines, the nanolines are configured to orient the LC molecules along a varying local orientation direction of each of nanoline in the subset. The varying local orientation direction of each nanoline in the subset can vary along a length of each nanoline.

20 Claims, 11 Drawing Sheets

(51) Int. Cl.
*G02F 1/315* (2006.01)
*G02F 1/313* (2006.01)
*G03F 7/00* (2006.01)

(52) U.S. Cl.
CPC ............ *G02F 1/315* (2013.01); *G03F 7/0002* (2013.01); *G02F 2001/133757* (2013.01); *G02F 2001/133769* (2013.01); *G02F 2001/133776* (2013.01); *G02F 2001/133792* (2013.01); *G02F 2203/24* (2013.01)

(58) Field of Classification Search
USPC .................................................. 349/123–131
See application file for complete search history.

(56) References Cited

U.S. PATENT DOCUMENTS

| | | | | |
|---|---|---|---|---|
| 2011/0051066 | A1* | 3/2011 | Ahn | G02F 1/13378 349/124 |
| 2015/0309370 | A1* | 10/2015 | Park | B29C 33/42 428/156 |
| 2019/0278172 | A1* | 9/2019 | Lee | H01L 21/0337 |

OTHER PUBLICATIONS

Qingbin Fan et al., Titled: "Visible light focusing flat lenses based on hybrid dielectric-metal metasurface reflector-arrays"—Mar. 2017: Scientific Reports, Mar. 23, 2017, 9 pages.

* cited by examiner

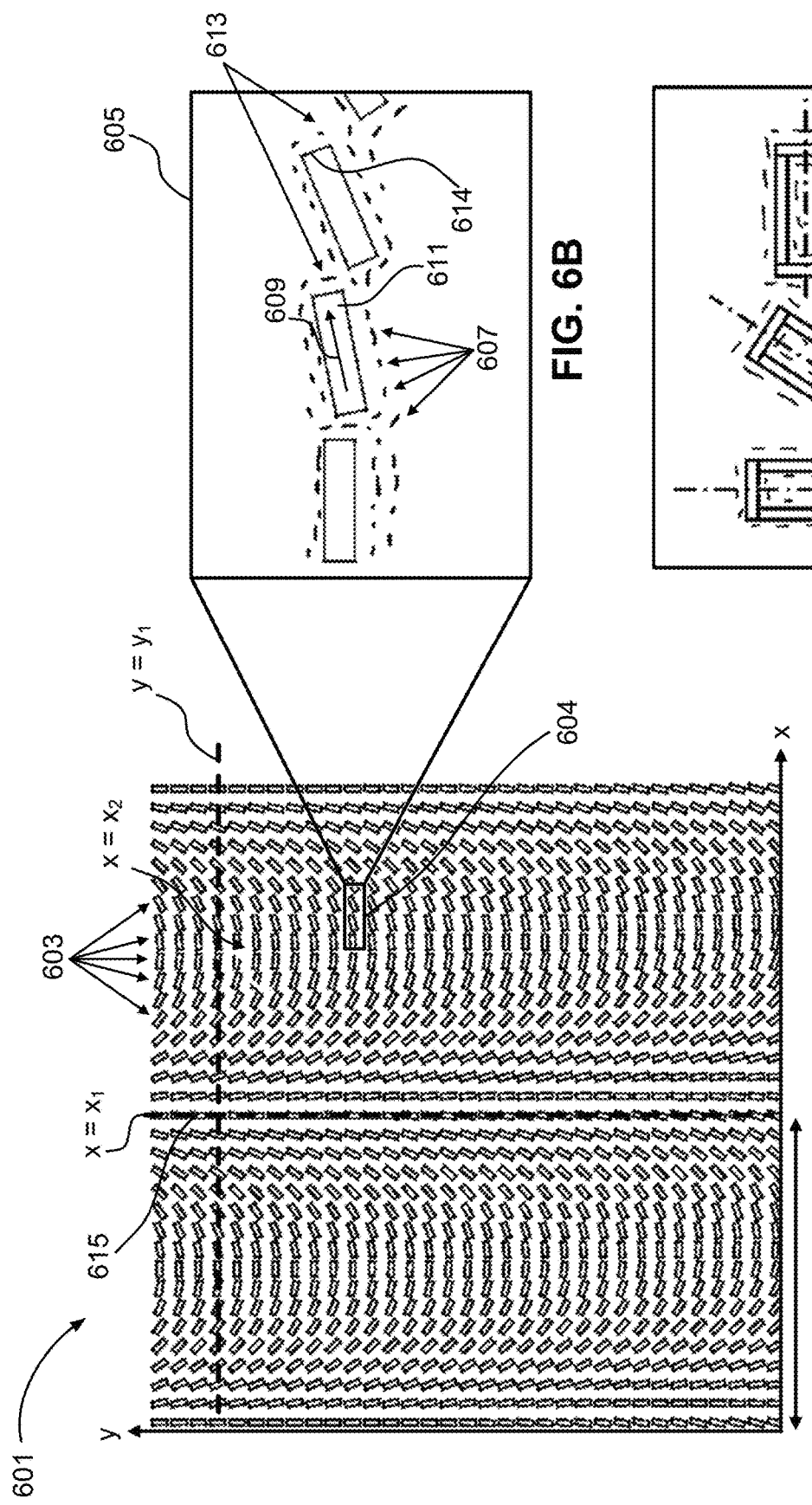
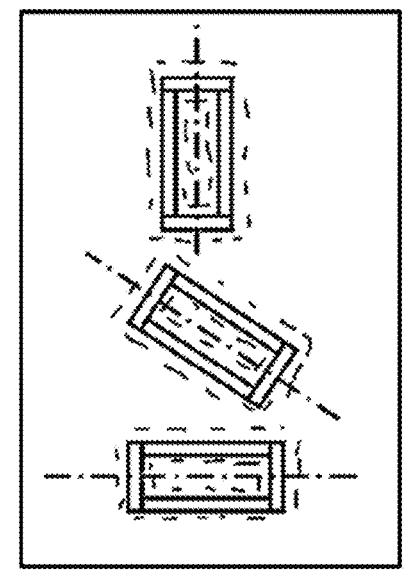
FIG. 6A
FIG. 6B
FIG. 6C

CONTINUOUS LIQUID CRYSTAL ALIGNMENT PATTERNS FOR GEOMETRIC PHASE OPTICS

CROSS-REFERENCES TO RELATED APPLICATIONS

This application claims priority to, and the benefit of, U.S. Application No. 62/509,032, filed on May 19, 2017, the disclosure of which is herein incorporated by reference in its entirety for all purposes.

BACKGROUND

Traditional liquid crystal devices are designed to have an alignment layer that provides a prevalent pattern axis. In a first state, the individual LC molecules can align with the prevalent pattern axis and in a second state, the LC molecules can align along a direction of an externally applied electric field. In this way, the optical properties of traditional LC devices can be switched on and off. For the case of switchable optical elements, the alignment layers can be engineered to impart a particular spatially dependent phase across an optical beam thereby resulting in a number of different functional optical elements such as lenses, beam steering elements, gratings, and the like.

Current methods of fabrication of geometric phase optics do not allow a high degree of customizability and throughput at a low fabrication cost, nor do they result in optical elements with high enough performance characteristics. For example, a rubbing method is commonly used to prepare the LC alignment layer by rubbing a soft polymer on a surface to generate microscopic grooves upon which LC molecules can align. Another commonly used method is pre-patterning. However, these methods are complex, slow, expensive, and can generate unwanted diffraction effects in the final product. Furthermore, current patterns for LC alignment layers are sub-optimal from an optical performance perspective and thus there exists a need for improved patterns geometries, regardless of how these patterns are manufactured.

SUMMARY

In some embodiments, a layered optical element includes a substrate layer, an electrode layer disposed on the substrate layer, a liquid crystal (LC) layer comprising LC molecules, and a nanopatterned alignment layer in physical contact with the LC layer and disposed on a surface of either the substrate layer or the electrode layer. The nanopatterned alignment layer includes an arrangement of nanostructures, e.g., a grouping of nanolines. For a subset of the grouping of nanolines, the nanolines are configured to orient the LC molecules along a varying local orientation direction of each of nanoline in the subset. The varying local orientation direction of each nanoline in the subset can vary along a length of each nanoline.

In some embodiments, the electrode layer is disposed on a first surface of the substrate layer, the nanopatterned alignment layer is disposed on a second surface of the substrate layer, and the first surface and second surfaces of the substrate layer oppose each other.

In some embodiments, the layered optical element further includes an opposing substrate layer, and an opposing electrode layer. The opposing substrate layer opposes the nanopatterned alignment layer and the LC layer is disposed between the opposing substrate layer and the nanopatterned alignment layer.

In some embodiments, the layered optical element further includes an opposing nanopatterned alignment layer in physical contact with the LC layer and disposed on either the opposing substrate layer or the opposing electrode layer, wherein the LC alignment layer is disposed between the nanopatterned alignment layer and the opposing nanopatterned alignment layer.

In some embodiments, the arrangement of nanostructures further includes at least one nanoline having a non-varying local orientation direction that does not vary along a length of the at least one nanoline.

In some embodiments, the varying local orientation direction of each nanoline in the subset can cause the layered optical element to impart a spatially dependent phase response to an optical beam that passes through layered optical element.

In some embodiments, one or more nanolines in the subset have a continuous slope along their entire length.

In some embodiments, a first phase response of the layered optical element at a first position along a length of at least one nanoline in the subset is different from a second phase response of the layered optical element at a second position along the length of the at least one nanoline in the subset.

In some embodiments, a width of each nanoline in the subset, as measured along a direction that is perpendicular to the varying local orientation direction, is smaller than 2 microns and wherein the length of each nanoline in the subset is larger than 1 mm.

In some embodiments, a width of each nanoline in the subset, as measured along a direction that is perpendicular to the varying local orientation direction, is smaller than 2 microns and wherein the length of each nanoline in the subset is larger than 20 microns.

In some embodiments, a width of each nanoline in the subset, as measured along a direction that is perpendicular to the varying local orientation direction, is smaller than a wavelength of light to be passed through the layered optical element.

In some embodiments, at least one of a shape or a length of nanolines in the subset depends on an (x,y) position of the nanolines on the nanopatterned alignment layer.

In some embodiments, each nanoline in the subset can be described by a continuous mathematical expression $g_1(x)$ and nanolines not in the subset can be are described by a different continuous mathematical expression $g_2(x)$. The function $g_i(x)$ can be derived from a function $\theta(x,y)$ that defines an orientation function for a plurality of nanorods, where $\theta(x,y)$ is an angle between a nanorod located at (x,y) and a horizontal axis in an x-y plane defined by a substrate surface. Furthermore, $g_i(x)$ can satisfy a differential equation given by $d/dx\ g(x) = \theta(x,y)$ along each nanoline in the subset.

In some embodiments, a nanoimprint pattern mold includes a mold substrate and a nanopattern layer disposed on the mold substrate, the nanopattern layer including a nanopattern on a surface thereof. The nanopattern includes an arrangement of nanostructures disposed across the surface of the nanopattern layer, and the arrangement of nanostructures includes nanolines. For a subset of the nanolines, a varying local orientation direction of each nanoline varies along a length of each nanoline. In some embodiments, the nanoimprint pattern mold can include nanolines that are described by one or more continuous mathematical expressions as already summarized above in reference to the layered optical element according to certain embodiments.

This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

The foregoing, together with other features and examples, will be described in more detail below in the following specification, claims, and accompanying drawings.

BRIEF DESCRIPTION OF THE DRAWINGS

Illustrative embodiments are described in detail below with reference to the following figures:

FIGS. 6A, 6B, and 6C illustrate a top view of a nanopatterned alignment layer, according to certain embodiments;

DETAILED DESCRIPTION

Figure 1:
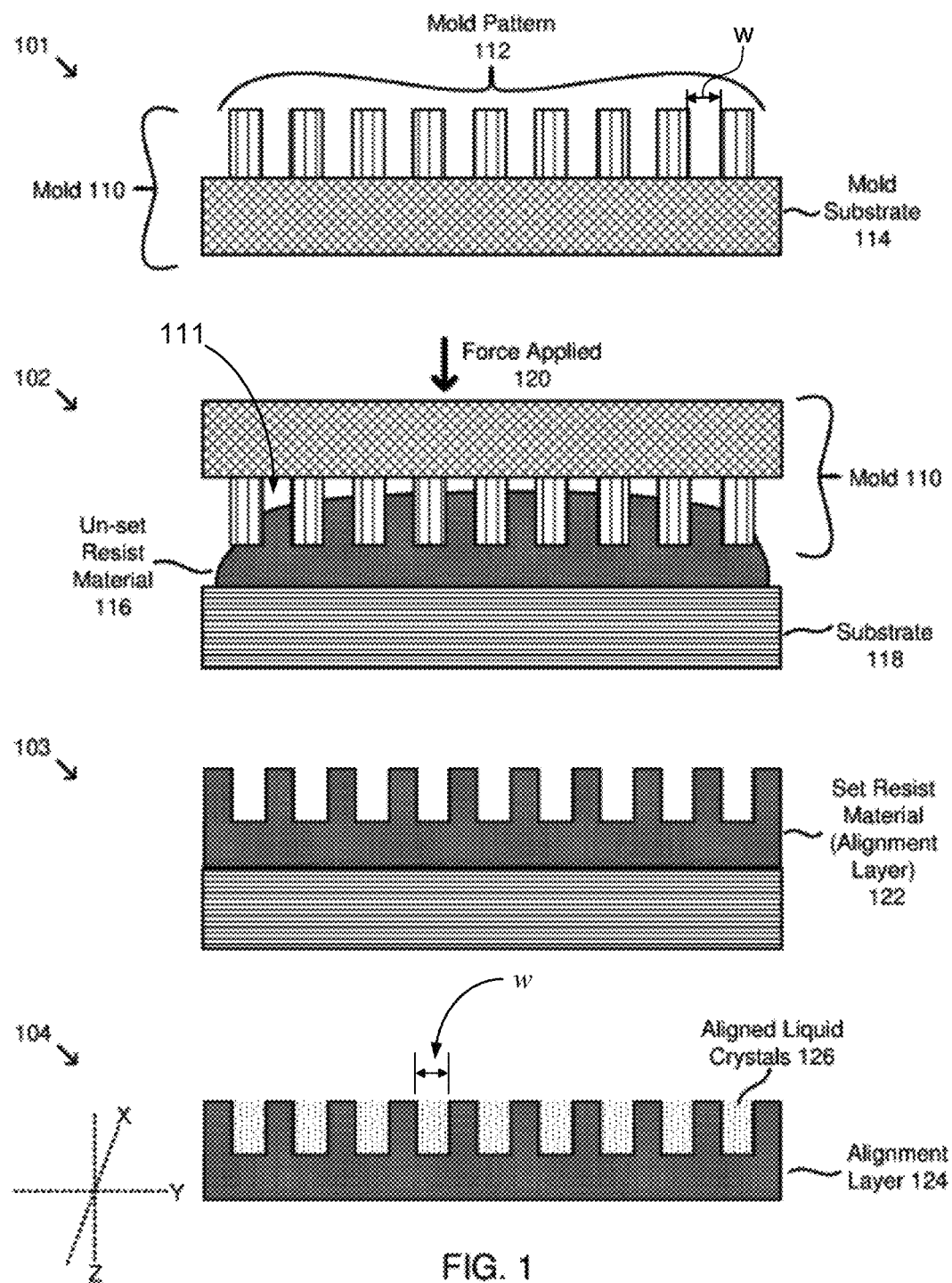
FIG. 1 is an example diagram of a process for creating a nanopattern alignment layer, according to certain embodiments.

The present disclosure relates generally to LC alignment layer templates, LC alignment layers made using those templates, and layered optical elements formed from one or more LC alignment layers. In addition, the present disclosure is generally directed to methods of manufacturing LC alignment layer templates, methods of manufacturing LC alignment layers using those templates, and methods of manufacturing layered optical elements that include one or more LC alignment layers.

More specifically, embodiments include a method of fabricating a liquid crystal (LC) alignment layer with nano-scale precision, high throughput, and low cost. A nano-scale mold is created using various lithography or other fabrication processes, such as photo-lithography, electron beam lithography, embossing, interferometric lithography, etc. The mold includes a negative of a LC alignment pattern. The mold is used to imprint on a resist material, e.g., a photoresist polymer, such that the resist material forms a pattern that is the inverse (i.e., negative) of the pattern created on the mold. The resist material is set or cured (e.g., by ultraviolet light), and a solution including LC molecules are deposited on the patterned resist material. Various LC alignment patterns and features (e.g., sub-10 nm features) may be formed using the nano-scale mold technique described here, which allow more detail compared to previous methods (e.g., rubbing). Furthermore, as the mold is created once but used multiple times, throughput can be high and costs can be low, even if the creation of the mold is relatively expensive.

Such a method allows the creation of an LC alignment pattern with high geometric complexity and customizability. For example, an intricate LC alignment pattern may be developed in order to produce a liquid crystal display that supports 3D viewing via alternate polarization of different pixels on the screen due to the customized alignment pattern.

Such a method can also allow for the creation of LC alignment patterns may be used to create optical elements such as, e.g., LC based lenses, diffraction gratings, beam steering elements, spatial light modulators and the like. Such optical elements may be used in, e.g., head-mounted displays (HMDs) for virtual/augmented/mixed reality systems.

The high degree of customization of the LC alignment layer may have other beneficial applications. This may include simplifying components or improving technologies in polarized light microscopy, photoelasticity analysis, polarization of radio/electromagnetic EM radiation signals, and other switchable optical functions, etc.

In some embodiments, the LC alignment layer includes an arrangement of nanorods or an arrangement of elongated, continuous nanolines that can serve as LC directors. Such a nanoline pattern can be quite complex and customizable. As described in more detail below in reference to FIGS. 6A-6C, by employing continuous nanolines instead of nanorods within the alignment layer, the number of nanofeature ends is reduced. Having a high density of nanofeature ends in the alignment layer can be detrimental to the optical performance of the finished optical element because LC molecules could potentially align along a direction that is perpendicular to the desired orientation direction of the LC molecule.

As used herein, the prefix "nano" is intended to refer to the width of the linear features that can be present on the alignment layer(s). Accordingly, the term "nanoline" should be interpreted broadly to refer to any linear feature that has a width in the range of 1,000 nm or less, 100 nm or less, 10 nm or less depending on the nanoimprint pattern templates/molds used and the optical application desired for the end product. In some embodiments, the mold patterns can be created, e.g., using e-beam lithography or any other suitable method for nanofabrication, e.g. double-, triple- and quadruple-patterning. The precise width of the nanoline for an alignment layer that is employed in an optical element can depend the type of liquid crystal used and on the wavelength of light being used in the optical system within which the optical element resides, e.g., on the order of 10's or 100's of nm, as would be appreciated by one of ordinary skill in the art.

According to certain embodiments, the length of the nanolines can be many orders of magnitude greater than their width, where the width of the nanoline is the extent of the nanoline measured along a direction that is perpendicular to the local orientation direction (i.e., tangent direction) at any point along the nanoline. For example, one or more nanolines can have macroscopic lengths that extend across the entire width of an optical element that itself may be on the order of fractions of a cm to multiple cm wide, for example. In this example, it is therefore possible for a nanoline to have a width of 10 nm and a length of 1 cm or more. Thus, a nanoline can have a large length-to-width ratio, e.g., on the order of $10^6$ or more. According to certain embodiments, nanolines can have many different length-to-width ratios without departing from the scope of the present disclosure, e.g., elongated nanolines can have a length-to-width ratios that is less than or equal to 10' and greater than or equal to $10^3$ and can even have length-to-width ratios that are as low as 2. Such elongated nanostructures are contrasted with other nanofeatures described herein and referred to as "nanorods" (e.g., such as the nanorods shown in FIG. 6A-6B) that may have length to width ratios on the order of 1. According to certain embodiments, nanorods can have length ratio that is less than or equal to 10 and greater than or equal to 1. As would be appreciated by one of ordinary skill in the art with the benefit of this disclosure, the precise length-to-width ratio for a nanoline can depend on the operating wavelength of the optical element within which the alignment layer is employed. For example, in the case of infrared light, the width of a nanoline can be 2 microns or smaller while the length could vary depending on the overall size of the optical element. For example nanoline lengths could be much larger than their respective widths and be on the order of 1 mm or even several centimeters e.g., as would be the case for an optical element that is employed within an AR/VR/MR headset. While the nanolines described below have constant widths along their length, one of ordinary skill having the benefit of this disclosure will appreciate that the nanoline width can vary along the length of the nanoline.

FIG. 1 is an example diagram of a process for creating a nanopatterned alignment layer, in accordance with certain embodiments. Although the description here is made in regards to certain materials and steps, it is not meant to imply that the process described here is the only order of operations available to achieve the resulting alignment layer or that the materials that may be used are limited to those described here. Furthermore, while FIG. 1 illustrates the components in the process as two-dimensional cross-sections, the components are actually three-dimensional. In addition, the patterns shown in FIG. 1 are meant only to be for explanatory purposes. In practice, the different patterns, such as the mold pattern 112 and resulting pattern for the alignment layer may be significantly varying across all three dimensions. As described in further detail below, FIGS. 6-8 illustrate some examples of alignment layer nanopatterns according to certain embodiments.

Furthermore the nanoimprint method described herein is but one of many ways to manufacture a nanopatterned alignment layer according to certain embodiments. As such the description provided below is not intended to limit the claims to nanopatterned alignment layers that have been manufactured only by way of nanoimprint lithography. As would be appreciated by one of ordinary skill in the art with the benefit of this disclosure, any manufacturing process can be used without departing from the scope of the present disclosure.

At stage 101, a mold 110 is formed. The mold 110 is comprised of a mold pattern 112 and a mold substrate 114. The mold substrate 114 and mold pattern 112 may be created from any material that may form a solid and which may be used to form nanometer scale (e.g., below 50 nm) features (i.e., the material of the mold is capable of forming distinct features at the nanometer scale). In some cases, the material that forms the pattern 112 could be the same material of the substrate 114 that has been etched through a patterned mask. If an additive material is added to constitute the pattern 112 this may be a polymer, metal, semiconductor, oxide, or other material, or combination of any of these materials. Examples of specific materials include silicon, nickel, polydimethylsiloxane, HSQ, poly-methyl methacrylate (PMMA), glass, and so on.

The choice of mold material may be dictated by the type of resist material 116 used. Depending on the method used to set or cure the resist material, a mold material may be selected that is substantially resistant or unaffected by the method of setting the resist material. For example, a UV-resistant mold material (e.g., silicon, quartz or fused silica) may be used when the resist material is cured using UV radiation. The mold material may also be chosen based on the type of method used to fabricate the mold. For example, if the mold is to be formed in part using an electron beam, then a portion of the mold 110 may be formed from PMMA, more commonly known as acrylic. PMMA is an electron beam resist, and may be coated on a quartz substrate, after which it is exposed to the electron beam pattern, and the exposed areas removed using a solvent. The mold material may also be chosen based on the type of manufacturing process. For example, nickel may be used for its high durability in the case where a certain amount of flexibility is desired in the mold due to a curvature desired in the alignment layer that is to be generated.

Although a planar mold 110 is illustrated in FIG. 1, in one embodiment the mold 110 may be cylindrical, spherical or curved in shape, with the mold pattern 112 formed on the exterior of the cylindrical, spherical or curved mold. As will be described below, the mold is placed on the resin material 116 in order for the resin material to take the inverse pattern present on the mold. In the case of a cylindrical, spherical or curved mold, the mold 110 would be rolled across the resin material to achieve the same effect. This allows for a repeating pattern to occur due to the cylindrical, spherical or curved shape. According to certain embodiments, the mold may have one or more curve surfaces (e.g., concave or convex surfaces) such that it may be used to create an alignment layer that is disposed on a curved surface.

If the mold is used directly to replicate the pattern on the liquid crystal substrate, the mold pattern 112 is formed to be the negative (i.e. the inverse) of the alignment layer that is to be created. Thus, a protrusion in the mold pattern 112 results in a depression in the alignment layer and a depression in the mold pattern 112 results in a protruding nanostructure in the alignment layer. In some embodiments, the mold is used to produce daughter-molds that are then used to imprint the alignment layer on the final substrate. In this case, the mold has the same lithography tonality of the alignment layer. Due to interactions between the liquid crystal molecules and the nanostructures of the alignment layer, the liquid crystal molecules can naturally align along the surfaces of the protrusions that form the nanostructures of the alignment layer. For example, the LC molecules can naturally rest within the depressions of the alignment layer in an orientation that reduces the potential energy of the LC molecules, which is determined by the interaction between the LC molecules and the surfaces of the nanostructures.

According to some embodiments, the mold pattern 112 is designed to be a negative of a desirable alignment pattern. As described above, the mold material may be one of many different types of materials. Depending upon the material used, different methods may be used to form the mold pattern 112. These may include photo-lithography, embossing, nanoimprint lithography (NIL), etching, scanning probe lithography, two-photon, electron beam, focus ion beam, lost wax casting, etc. For example, photolithography may be used to create the mold pattern 112 on top of the mold substrate 114. Using photolithography, a fabrication process (e.g., at a semiconductor foundry) may form layer after layer of photoresist and photomask made from light sensitive and insensitive materials, exposing each layer of photoresist to light as well as etching each photoresist layer, until a detailed three-dimensional pattern is generated as the mold pattern 112. Depending on the material and fabrication process used for the mold pattern 112, the feature size (e.g., the minimum width w for each feature in the mold pattern 112) may be 10 nanometers or less. In some applications larger feature sizes may be employed, such as feature sized between 10 nm and 200 nm.

Although this initial fabrication of the mold pattern 112 may be relatively expensive, subsequent usage of the mold 110 in the formation of the alignment layer may be much cheaper in comparison. The exact type of mold pattern 112 that is created depends upon the type of alignment layer that is desired. For example, the mold pattern 112 may be designed such that the resulting alignment layer modifies the polarization and/or phase of a light beam that passes through it (after LC molecules have been deposited) to a desired configuration. Some examples of possible mold patterns are shown in FIGS. 6-8 but any pattern is possible without departing from the scope of the present disclosure.

As can be appreciated by one of ordinary skill in the art with the benefit of this disclosure, the minimum width w for any feature in the mold pattern depends not only on the technical capability of the fabrication process used to make the mold but also on the particular design of the mold pattern itself. For example, for mold patterns that are to be used within geometric phase optics operating in the infra-red (IR), e.g., 800 nm-2 microns, the minimum feature size may be larger than 10 nm and can be determined by the required optical performance of the fabricated optical element.

At stage 102, the mold 110 is pressed against an un-set resin material 116 that has been deposited on a substrate 118. The substrate 118 supports the resin material 116 and may be made of the same or different material as the mold substrate 114. According to certain embodiments, the substrate 118 may be temporary such that it can be removed from the alignment layer at some point after the nanoimprint process is complete.

The un-set resin material 116 is resin material that has not been set or cured, i.e., is still malleable. The resin material 116 is not limited to photoresist material, and can be any resin material without departing from the scope of the present disclosure, e.g., the resin can be set by temperature (by heating above a curing temperature), by chemical reaction, or by some other means. When set, the resin material 116 becomes rigid and not deformable. However, before setting, the resin material 116 is malleable and therefor deforms when pressure is applied to it. During the pressing stage, the mold 110 is pressed against the resin material 116 with an applied force 120, causing the resin material to fill the voids and cavities of the mold 110, e.g., void 111. The amount of applied force 120 is sufficient to allow the un-set resin material 116 to be forced into the voids in the mold 110 (e.g., 120 N/m$^2$). The applied force 120 may be applied for a certain period of time (e.g., 10 seconds). Furthermore, a certain temperature (e.g., 170° C.) may be maintained throughout the duration, and/or a certain internal temperature for the resin material 116 may be maintained throughout the pressing stage (e.g., via the use of heating elements). This internal temperature may be above the glass temperature for the resin material 116 (i.e., a temperature above which the resin material 116 is able to deform in response to applied forces).

The un-set resin material 116 and/or the set resin material 122 can be transparent or nearly transparent to a range of EM frequencies, such as the range of visible and/or IR light frequencies. Thus, the alignment layer 124 can be capable of allowing some range of EM radiation to pass through it to the liquid crystals. The un-set resin material 116 may be some form of thermoplastic, polymer, optically transparent photo-resist, and so on.

The mold 110 may be pressed into the un-set resin material 116 using a hydraulic press, flip chip bonder, or any other device capable of exerting a physical force against two objects. In other examples, the mold may be held stationary and the substrate 118 may be deformed by vacuum and/or gas pressure as described in U.S. patent application Ser. No. 15/703,926 titled "Nanoimprint Lithography Systems and Methods" that is incorporated by reference herein in its entirely for all purposes.

After the prescribed press time, the un-set resin material 116 is set or cured. This may occur using exposure to light, e.g., UV light, if the resin material 116 is photo-polymer, or by heat energy at a specific curing temperature, if the un-set resin material 116 is temperature cured, or by other means, such as application of a curing chemical. As the process for setting the resin material may cause shrinkage or other changes in the shape of the un-set resin material 116, a suitable resin material that does not change shape significantly after curing or setting may be used, or the mold 110 may be developed to a size not directly inverse to the desired alignment layer size in order to compensate.

In one embodiment, both the mold 110 and substrate 118 may include alignment features, such as optical or electronic markers, mechanical alignment apparatus, or other features such that the mold 110 is pressed onto the temporary substrate 118 in the same position for each application of the mold 110.

At stage 103, after the resin material 112 is set, the mold 110 is removed. In one embodiment, an anti-adhesion substance (e.g., fluorinated compounds such as Teflon) is applied to the mold pattern 112 to ensure that the resin material 116 does not adhere to the mold pattern 112 during formation of the alignment layer from the resin material 116. Any excess resin material 116 may also be etched away or physically removed (e.g., Reactive Ion etching, Inductive couple plasma etch, Ion beam etch, wet etch, etc. . . . ).

At stage 104, a liquid crystal material may be deposited in or on the alignment layer 124. Due to the pattern in the alignment layer as specified in mold 110, the LC molecules align in accordance with the pattern of the alignment layer to form aligned liquid crystal molecules 126. Further examples of aligned liquid crystal molecules according to some embodiments are described below in reference to FIGS. 6-8. For the sake of simplicity, the individual constituents of the LC material are referred to herein as "molecules" but other types of LC constituents are possible without departing from the scope of the present disclosure. For example, individual LC constituents may be aggregations or clusters of one or more molecules, one or more engineered nanoparticles, or any other particle that can orient itself with the features of the alignment layer and also orient itself with an externally applied electric field.

In some embodiments, in addition to the process described above, the mold 110 can be first replicated into a daughter mold (i.e., another mold). The daughter mold may be made of a flexible material (e.g. a silicone, PET, or combination of plastics) and is used to create the alignment layer 124, while the mold 110 is designated as the master mold and is used to create daughter molds only. This can increase the longevity of the original mold 110.

Using the method described above, nanopatterned alignment layers can be fabricated at low cost and high throughput. These nanopatterned alignment layers can be used to align liquid crystal molecules into one or more spatially varying patterns on flat, cylindrical, spherical, or any curved surface. The spatially varying liquid crystal layer that results from the alignment of the liquid crystal molecules with the alignment pattern may have many applications, such as for enhanced 3D displays, for use in switchable optical elements such as spatially varying phase retardation plates (also known as spatial light modulators), geometric-phase lenses, geometric-phase beam steering components, and the like.

Figure 2:
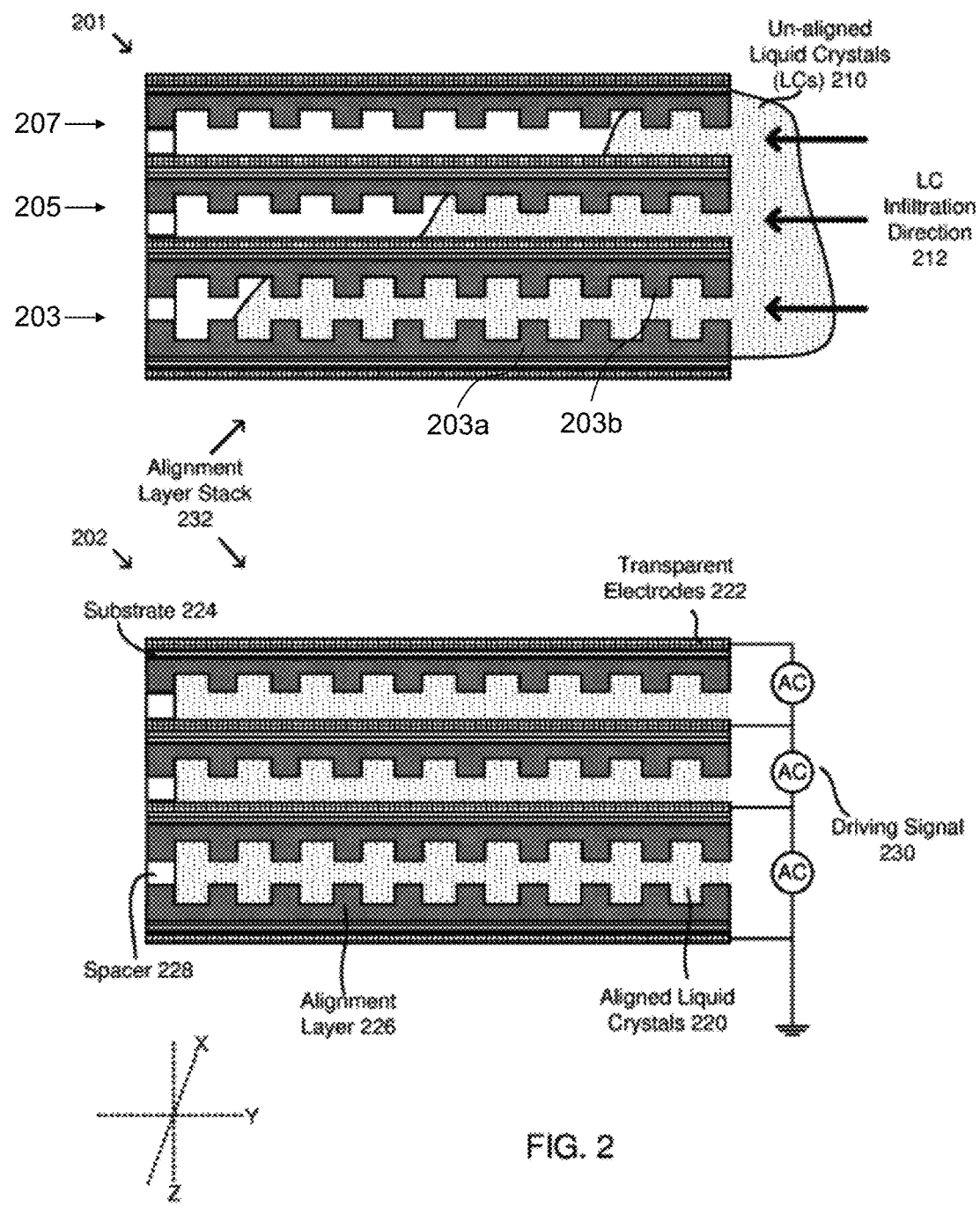
FIG. 2 illustrates a continuation of the process from FIG. 1 of the infiltration of liquid crystals into a completed stack of alignment, electrode, and substrate layers, according to certain embodiments.

FIG. 2 illustrates a continuation of the process from FIG. 1 including further description of the infiltration of liquid crystals into a completed optical element that includes a stack of alignment layers, electrode layers, and substrate layers, according to certain embodiments.

After forming the nanopatterned alignment layer(s), e.g., according to the process described above in reference to FIG. 1, the fabrication process may layer multiple alignment layers into a single stack 232. In general a multi-layer optical element can be formed from a stack having any number of layers. For example, the stack 232 shown in FIG. 2 has a double alignment layer 203, with two alignment layers 203a and 203b facing each other, along with two single alignment layers 205 and 207 layered on top of the double alignment layer 203. Each alignment layer can be also placed directly adjacent to a substrate 224, and each substrate can be placed directly against a layer of transparent electrodes 222 as shown in the lower portion of FIG. 2. In some embodiments, the order of the substrate and electrode layers can be reversed from that shown here, i.e., the electrode layer can be placed directly against the alignment layer with the substrate placed on top of the electrode. The alignment layers can be separated by one or more spacers 228, which may be made of the same or different material as the substrate 224. The various layers may be adhered to each other using an adhesive that is transparent to the same range of EM radiation to which the alignment layers 226 are transparent. Each layer may include alignment features, e.g., alignment features that are optical, physical, electrical, etc., that assist the fabrication process in aligning the layers together.

In operation, the layers of transparent electrodes 222 are electrically coupled to driving signal(s) 230 that can be generated by a switchable AC signal generator (not shown). Each layer of transparent electrodes 222 may be patterned or un-patterned. Application of a driving voltage signal, e.g., an AC voltage signal, to a pair of transparent electrodes 222 causes the LC molecules between those two electrodes to align with the time-averaged direction of the resulting electric field that is generated between the pair of transparent electrodes 222 rather than align with the local orientation directions of the nanostructures of the alignment layer. Thus, during the time that the AC voltage signal is applied, the optical response of the multilayer stack can be quite different from the optical response with no voltage applied, thereby providing a switchable optical component.

FIG. 2 shows a stack 232 under two stages of manufacture. At stage 201, the LC molecules are introduced into the stack and can flow into the voids between the alignment layers along the LC infiltration direction 212 via, e.g., capillary action. The actual gap between the alignment layers may be of a size such that capillary action is possible (e.g., <1 µm). Once a sufficient amount of LC molecules have infiltrated the alignment layer stack 232, e.g., such that no air gaps exist within the alignment layer stack 232, the infiltration point may be sealed, e.g., using another spacer similar to spacer 228 (not shown). Next, the electrical connections for the driving signal 230 may be coupled to the alignment layer stack 232 if they had not been previously.

Depending on the choice of the alignment layer material and LC molecules, the LC molecules within the alignment layer stack naturally align with a local surface (i.e. along a tangent or longitudinal direction) of the nanopattern directors that make up the alignment patterns on the alignment layers 226. In the case of a double alignment layer, the LC molecules may align at one end according to the pattern of one alignment layer, and then gradually twist such that at the other end, the LC molecules aligned according to the pattern of the opposing alignment layer. In the case of the single alignment layer (i.e., where an alignment layer faces a substrate or layer of transparent electrodes only), the LC molecules may align in accordance with the alignment pattern on the alignment layer (e.g., each LC may align with the nearest pattern). As noted above, LC molecules align according to the depressions in each alignment pattern on each alignment layer 226.

By varying the number of layers in the alignment layer stack 232, the applied voltage in the driving signal 230 to each layer, the patterns in each layer (via the molding process), the path, orientation, speed, phase and other characteristics of EM radiation passing through the alignment layer stack 232 can be varied. The ability to vary the properties of the alignment layer(s) within each stack allows for the stacks to be employed as various switchable optical elements, such as lenses, diffraction gratings, beam steering elements, phase masks/spatial light modulators, etc. The fabrication of the alignment layer stack 232 via the molding process described above with reference to FIG. 1 allows each stack 232 to be created quickly and with low expense, allowing the viable mass production of these switchable optical components.

Figure 3:
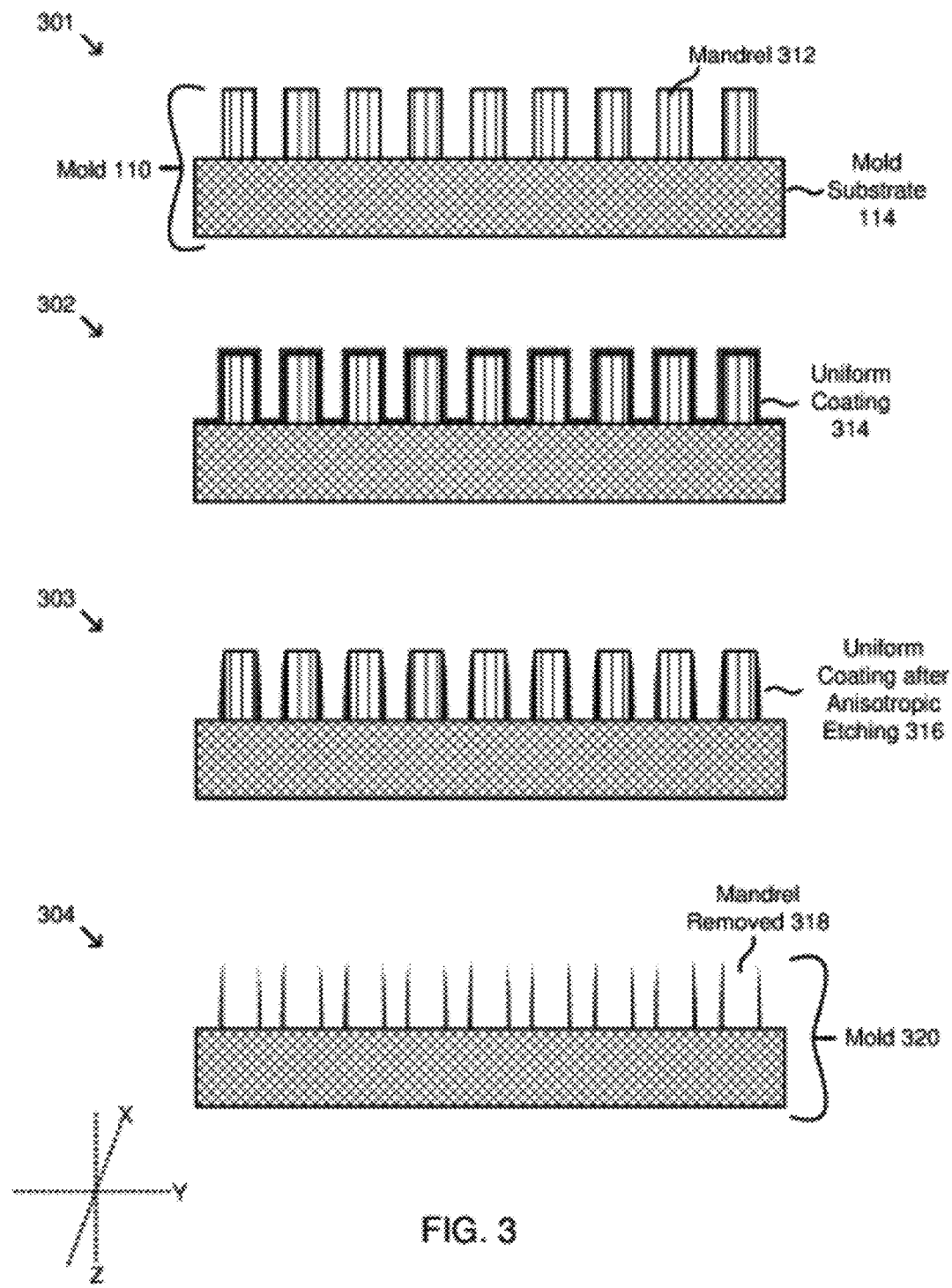
FIG. 3 illustrates an alternate process of forming an alignment layer using double patterning, according to certain embodiments.

FIG. 3 illustrates an alternate process of forming an alignment layer using a process referred to herein as double patterning, according to some embodiments. Although the description here is made in regards to certain materials and steps, it is not meant to imply that the process described here is the only order of operations or that the materials that may be used are limited to those described here. Furthermore, while FIG. 3 illustrates the components in the process as two-dimensional cross-sections, the components are three-dimensional in practice. In addition, the patterns shown in FIG. 3 are for explanatory purposes only. In practice, the different patterns, such as the mold pattern in mold 320, may be of any form without departing from the scope of the present disclosure.

At stage 301, the mold 110 is formed similarly to the process described above with reference to FIG. 1. However, the mold pattern 112 from FIG. 1 is instead used to form mandrels 312, rather than the alignment pattern or its inverse. As described below, these mandrels 312 are ultimately removed. At stage 302, a uniform coating 314 is deposited onto the mold 110 such that the surface of the mold substrate 114 and the exposed sections of the mandrels 312 include a coating of a uniform thickness (e.g., 5 nm thick). The uniform coating 314 may be made of a different material than the mold material, and so can be etched away without affecting the mold material. The uniform coating 314 may be applied using plasma or thermal atomic layer deposition, sputtering, various types of chemical vapor deposition or physical vapor deposition, or using some other method that is able to apply a uniform coating onto a surface.

At stage 303, the uniform coating is anisotropically etched away to form the uniform coating after anisotropic etching 316. During the anisotropic etching process, the portion of the uniform coating 314 on the surface of the mold substrate 114 is etched away completely. The portion of the uniform coating 314 deposited on the mandrels 312 are also etched completely. The portion of uniform coating 314 on the sidewalls of the mandrel 312 experiences an etching rate which is much lower than the portion of uniform coating 314 on top of the mandrels 312 and substrate 114. Thus, after the anisotropic etching 316, the uniform coating 314 is only present on the sidewalls of the mandrels 312. In some cases, the uniform coating 314 on the sidewalls of the mandrels 312 may be etched with different etch rates according to the position along the height of each mandrel 312. For example, the portion of the uniform coating on the top surface of each mandrel is etched away completely while the portions on the sides of each mandrel are etched away such that more material is etched away from the nearer the top of the mandrel than the bottom. The result is a gradient where the uniform coating is thicker at the bottom of each mandrel 312 and thinner at the top. In some embodiments, a high degree of anisotropic etching may be achieved using etching equipment such as Inductive Couple Plasma etchers or Ion Beam etchers.

At stage 304, the mandrels 312 are removed thereby forming voids 318. The mandrels 312 may be removed by physical removal, etching, or any other fabrication method. The resulting mold substrate 114 and uniform coating after anisotropic etching 316 forms the mold 320 created using this double patterning process.

Subsequently, the mold 320 may be used to create an alignment layer with an alignment pattern that is the inverse of the mold pattern of the mold 320, e.g., in a process similar to that described above in reference to FIG. 1.

The double patterning method used here allows for the creation of features with twice the resolution of the lithography limit. Thus, if the lithography supports a 50 nm feature size, this allows twice the resolution, or 25 nm. Advantageously, sub-wavelength features can be created that suppress the diffractive orders in the visible range of wavelengths that can be caused by alignment layers having a larger feature size. The suppression of the grating orders in the sub-wavelength regime can be understood by solving the grating equation for the resulting alignment layer pitch after double-patterning. A proper design of the alignment layer yields an effective grating pitch for which all diffraction orders of light in the visible spectrum are evanescent. Another way to explain this phenomenon is to imagine the surface behaving more like an "effective medium" or "metamaterial" for the EM radiation as would be understood by one or ordinary skill in the art having the benefit of this disclosure.

Furthermore, as in FIG. 1, the mold 320 needs only to be fabricated once in order to subsequently imprint multiple alignment layers composed of the resin material. These alignment layers stacked together may be used to create various optical elements, e.g., geometric-phase lenses and the like.

Figure 4:
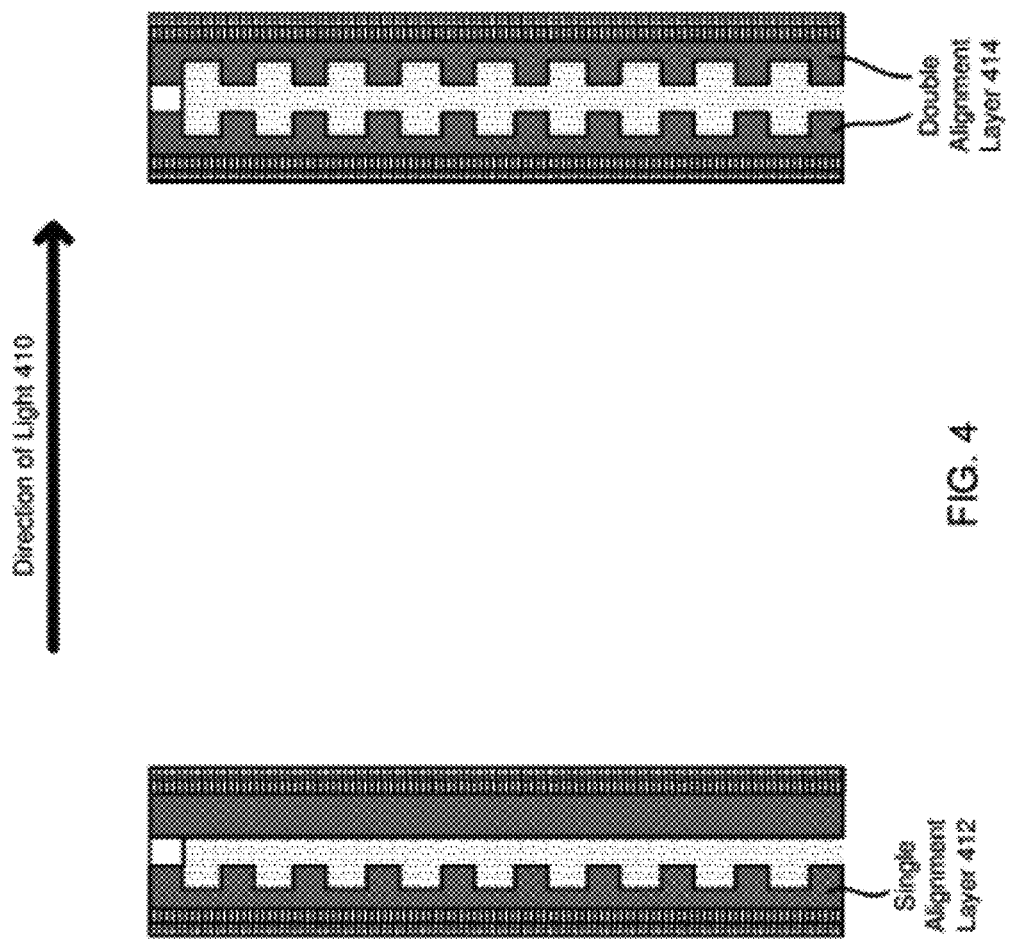
FIG. 4 illustrates two alternative arrangements of alignment layers in an alignment layer stack, according to certain embodiments.

FIG. 4 illustrates two alternative arrangements of alignment layers in an alignment layer stack, according to certain embodiments. As shown previously in FIG. 2, two alignment layers may face each other in the alignment layer stack, as shown with the double alignment layer 414, or alternatively, an alignment layer may face a blank substrate as shown in the single alignment layer 412. The blank substrate may be comprised of the same or different material as the alignment layer 412.

In the case of the single alignment layer 412, the LC molecules can align according to the pattern of the single alignment layer 412 only, as the opposing face has no alignment pattern. In the case of the double alignment layer 414, LC molecules align at both sides according to the alignment patterns on both alignment layers of the double alignment layer 414. For either the single alignment layer 412 or the double alignment layer 414, the applied voltage forms an electric field that permeates the LC layer. If strong enough, the force produced by the electric field can prevail over the force (e.g., van der Waals forces) that cause the LC molecules to align with the nanostructures of the nanopatterned alignment layer. In such a case, the orientation of the LC directors can preferentially align with the electric field lines of the applied electric field thereby altering the optical response (e.g., phase and/or polarization response) of the multilayer optical element, e.g., by modifying the spatially dependent optical birefringence of the LC layer. In some embodiments, a combination of single and double alignment layers, each with specialized alignment patterns can be used to achieve various optical elements having tailored switchable optical responses.

Figure 5:
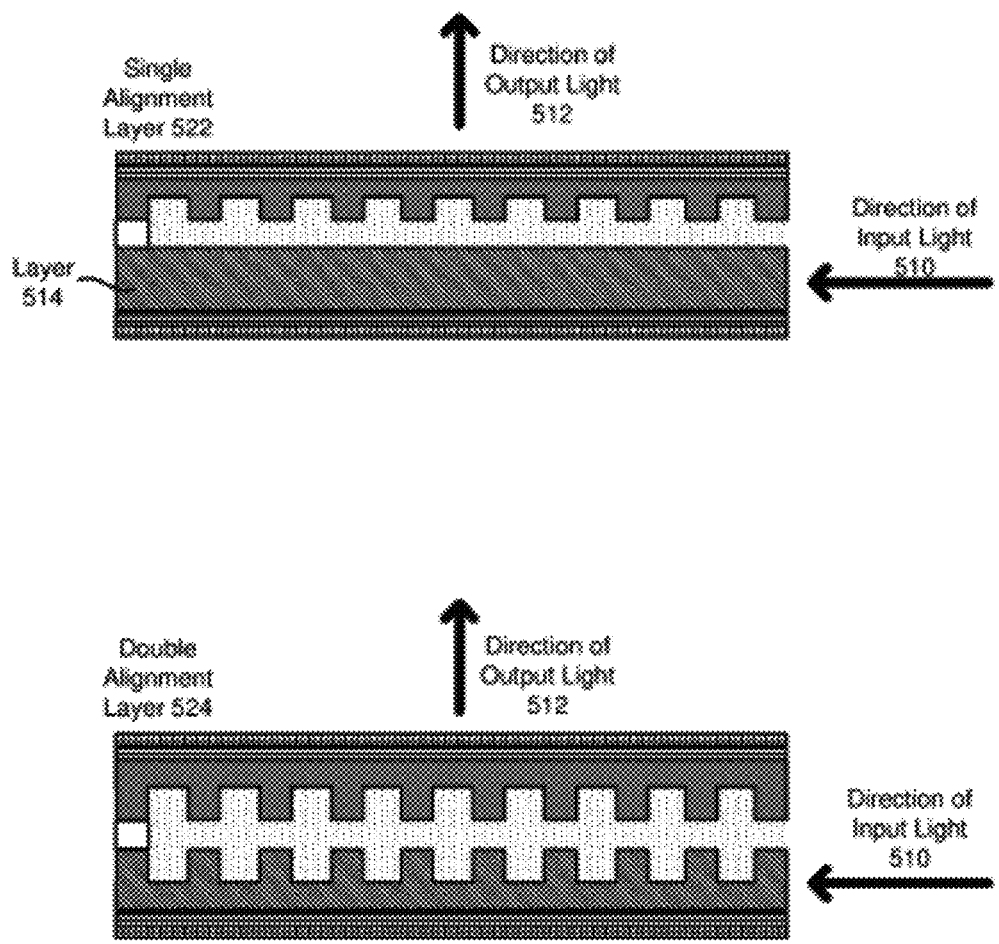
FIG. 5 illustrates an arrangement of alignment layers in an alignment layer stack with orthogonal input and output light directions, according to certain embodiments.

FIG. 5 illustrates an arrangement of alignment layers in an alignment layer stack with input and output light directions being orthogonal to each other, according to an embodiment. As shown previously in FIG. 4, two alignment layers may face each other in the alignment layer stack, as shown with the double alignment layer 524, or alternatively an alignment layer may face a blank substrate as shown in the single alignment layer 522. In other embodiments, more than two alignment layers may be employed.

In FIG. 5, the direction of input light 510 (or other EM radiation) is orthogonal to the direction of output light 512. Light enters the structure from waveguide layer 514, which is introduced beneath the alignment layer stack to guide the light in the plane (in-plane coupling). According to some embodiments, waveguide layer 514 may be 0.1 to 2 mm thick and may be a single mode or multimode waveguide. Light entering layer 514 from the direction 510 reflects internally until it interacts with the LC layer. The switchable optical function performed by the LC layer enables light to escape the waveguide and alignment layer stack along the direction 512 depending on the applied electric field. Such a design as shown here allows light to be redirected in a different direction in a switchable manner, as well as manipulated with regards to polarization and phase as described above. As shown in FIG. 5, the in-plane coupling approach can be adopted with both a single-, double- or multi-alignment layer configuration without departing from the scope of the present disclosure.

As alluded to above, the nanoimprint method and multilayer stacks described above can employ a number of different patterns in the nanopatterned alignment layer. For example, FIG. 6A shows one example of a nanopatterned alignment layer 601 (also referred to herein as an "alignment layer") according to certain embodiments. The alignment layer 601 can be manufactured as described above, e.g., by the nanoimprint lithography process described above in reference to FIGS. 1 and 3. Likewise, the alignment layer 601 can be one layer in a multi-layer arrangement as described above in reference to FIGS. 2-5. Alignment layer 601 can be employed as an alignment layer within a multilayer optical element, such as a beam steering element, a polarization phase grating, and the like. The particular alignment layer pattern shown in FIG. 6A is shown here merely for the purposes of illustration and one of ordinary skill will appreciate that many different alignment layer patterns may be employed without departing from the scope of the present disclosure.

Alignment layer 601 can be formed by a group of structural elements such as protrusions or recesses on an alignment layer surface. These protrusions or recesses in the alignment layer surface are referred to herein as nanostructures and may be any shape, e.g., FIG. 6A shows nanostructures that are nanorods dispersed within the plane of the surface of the alignment layer. A small subset of these nanorods are shown as nanorods 603. As described above, an LC material layer including LC molecules can be in physical contact with the alignment layer 601. Interactions between the LC molecules and the surfaces of the structural elements that form the nanopattern (in this case the individual nanorods) of the alignment layer cause the majority of the LC molecules to align along the orientation directions of the nanorods, as shown in FIG. 6B. For example, the LC molecules (a subset of which are shown as LC molecules 607) are aligned along a direction that is parallel to the nanorod orientation direction 609.

One or more physical properties of a light beam can be affected by the aligned LC molecules as the light beam passes through an LC alignment layer such as alignment layer 601. For example, a spatially dependent phase shift may be imparted onto the beam due to the interaction of the light with the LC molecules because the LC molecules can have spatially dependent orientations across the alignment layer. The amount of phase shift can depend on the orientation between the polarization of the incoming light beam and the orientation of the LC molecule and thus the orientation of each individual nanorod on the alignment layer surface. For example, the orientation angle of nanorod 615 having a center that is located at the position $(x_1, y_1)$ on the alignment layer is −90 degrees (relative to the x-axis). As x increases from $x=x_1$, the orientation angle of each successive nanorod increases until the point $x=x_2$ where the nanorod orientation angle is approximately 0 degrees. Moving further outward in the +x direction, the orientation angle continues to increase until it reaches +90 degrees (equivalent to −90 degrees). Because the majority of the LC molecules are aligned along the orientation directions of each nanorod, the type of pattern shown in FIG. 6A can impart a spatially varying, periodic phase shift across a beam (in the x-direction). The period of the periodic phase shift can be determined by the period of the changing orientation angle of the nanorods (also in the x-direction) indicated by the length scale A.

While FIG. 6A shows a specific example of a nanorod pattern, more general patterns may be employed without departing from the scope of the present disclosure. For example, each nanorod may be centered at a position (x,y) in the x-y plane and have an orientation angle of θ(x,y), i.e., in general, the orientation angle can depend on both the x- and y-position of the particular nanorod in the alignment layer. The precise form for the function θ(x, y) that defines the orientation of each nanorod can be chosen based on the desired optical response of the optical element. For example, the pattern chosen for the layer shown in FIG. 6A results in a beam steering optical element. In this case, the orientation of the nanorods varies only along the x direction according to the function $$\theta(x) = \frac{\pi}{\Lambda} x \qquad (1)$$

where Λ is the length scale associated with the periodicity of the pattern. Any number of horizontally distributed groups of nanorods having any functional form for θ(x, y) may be employed without departing from the scope of the present disclosure.

Returning to the inset of FIG. 6B, it may be the case that not all of the LC molecules are aligned with the orientation direction because ultimately the orientation direction is parallel to the local surface direction of each nanorod. For example, nanorods 613 can be aligned along the local orientation of the end of each nanorod, e.g., along the surface of nanorod end 614. Thus, the LC molecules that are in close proximity to any nanorod end can be aligned nearly orthogonal to, i.e. perpendicular to, the orientation of the nanorod. This orthogonal orientation may result in an optical response that is drastically different from that desired, e.g., a phase or polarization change that is 90 degrees out of phase with the desired change. While it may be the case that the majority of LC molecules are aligned properly, having a non-negligible population that are aligned along the nanorod ends can lead to scattering and reduced performance of any optical element that employs a nanorod based alignment layer.

Furthermore, the undesirable effect of LC alignment along nanorod ends is amplified for so-called "double-patterned nanorods" that can have hollow central portions as shown in FIG. 6C. As described above in reference to FIG. 3, such double-patterned nanostructures can have beneficial optical properties, but because they effectively have twice as many ends where LC molecules can become improperly aligned, the overall optical performance can suffer.

Figures 7A, 7B:
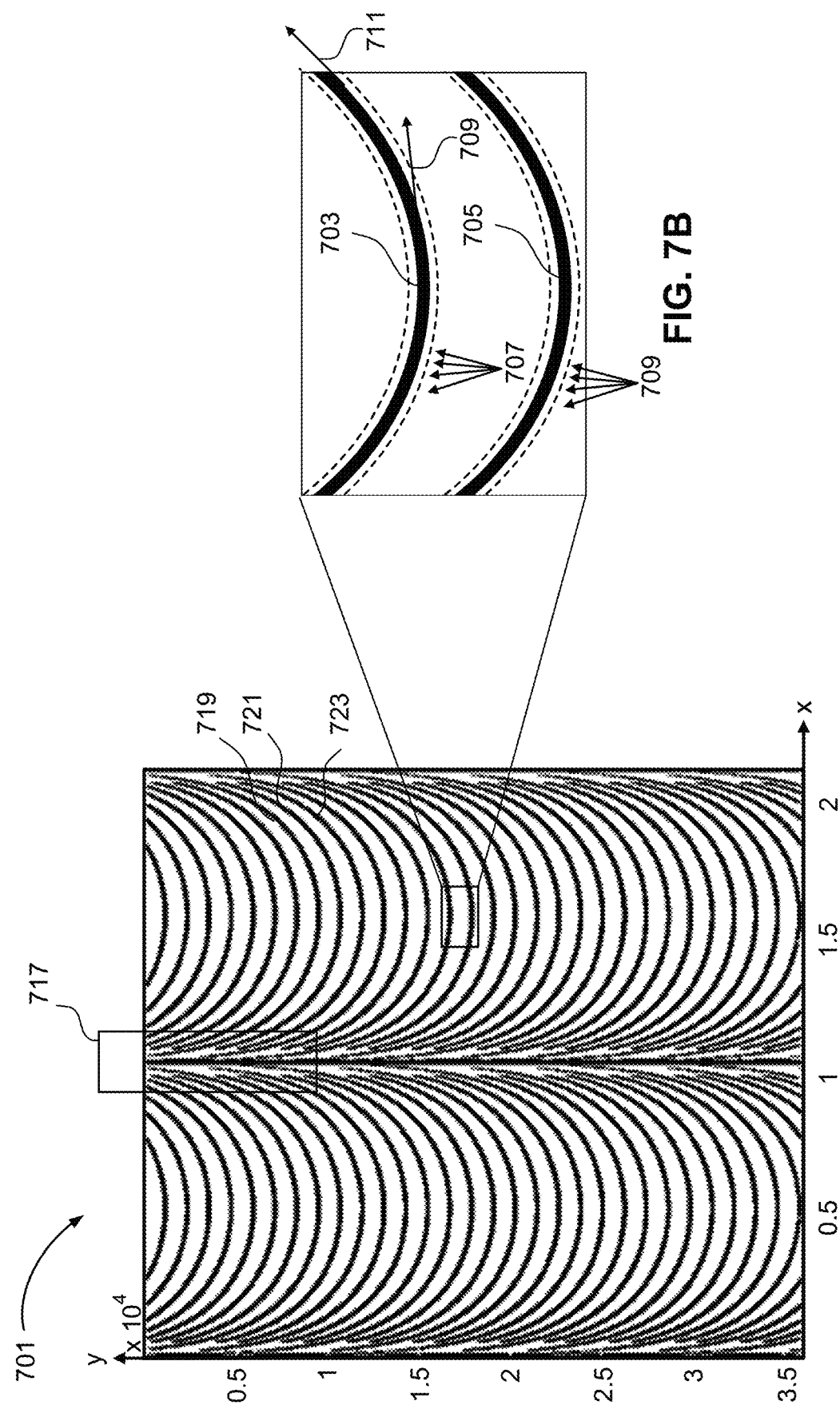
FIGS. 7A-7C illustrate views of a nanopatterned alignment layer, according to certain embodiments.

FIG. 7A shows an example of a nanopatterned alignment layer 701 for a beam steering optical element like that described above, but employing continuous nanolines instead of nanorods. Such a pattern advantageously reduces the number of nanofeature ends where LC molecules could potentially align along a direction that is perpendicular to the desired orientation direction of the LC molecule. The alignment layer 701 can be manufactured as described above, e.g., by the nanoimprint lithography process described above in reference to FIGS. 1 and 3. Likewise, the alignment layer 701 can be one layer in a multi-layer arrangement as described above in reference to FIGS. 2-5. An alignment layer employing nanoline features can be employed as an alignment layer within a multilayer optical element, such as a beam steering element, a geometric phase lens, a polarization phase grating, and the like. The particular alignment layer pattern shown in FIG. 7A is shown here merely for the purposes of illustration and one of ordinary skill will appreciate that many different alignment layer patterns may be employed without departing from the scope of the present disclosure.

For the specific nanopatterned alignment layer 701 shown in FIG. 7A, each nanoline of the nanopattern can be described by the following continuous mathematical function $$g(x) = -Re\left(\log\left|\cos\frac{\pi}{\Lambda}x\right|\right) \qquad (2)$$

that defines the y-position of each point of any given nanoline, where Λ and x are defined as in Eqn. (1) above. The spacing between individual nanolines can vary but in general the pattern should be dense enough for the LC molecules to be substantially aligned but not so dense that the LC material can flow within the grooves that separate respective nanolines. In some embodiments, separations between nanolines one the order of a few microns is sufficient.

As already described above, such a pattern can be formed by way of a nanoimprint lithography process using a nanoimprint template or mold. The mold can be made in any number of ways, e.g., using an e-beam lithography process or the like. In the case of e-beam lithography, a pattern of nanolines like that shown here, e.g., described by a continuous mathematical function like Eqn. (2) can be preferable to a pattern that employs an arrangement of nanorods because a nanoline pattern can be manufactured faster and with better accuracy. This is because for the case of nanorods, the lithography beam (e.g., e-beam, or the like) must be turned off (also known as blanking) in between patterning each nanorod. The blanking process can add artifacts unless a very slow patterning time is employed, and therefore expense, to the mold fabrication process. Given that a nanopattern mold for any macroscopically sized optical element can have millions or even billions of nanorods, employing a blanking process between each nanorod can add a significant amount of time and complexity to the control system. To the contrary, to write a nanoline, the control system can be programmed to continuously direct the lithographic beam along a direction described by the equation (or numerical representation of the equation) that describes the line. In other words, the equation (or numerical representation of the equation) that describes the line can be directly translated into a continuous equation of motion for the lithographic beam without the need to interrupt the beam with a blanking process as the beam traverses the mold surface.

Additionally, nanolines can be advantageous to nanorods because a pattern formed from nanolines minimizes the presence of nanofeature ends that can cause LC molecule misalignment as already described above. For example, FIG. 7B shows a magnified region of the nanoline alignment layer of FIG. 7A with central portions of two nanolines 703 and 705 being visible. The LC molecules, e.g., LC molecules 707 and 709, are aligned along the local surface directions of each nanoline, i.e., along the directions that are tangent to the nanoline at a particular point in the x-y plane. Thus, LC molecule alignment is proper along the entire length of the nanoline because the nanoline itself defines the desired LC direction.

As described above, because the nanoline defines one continuous feature rather than a composite feature formed from a group of nanolines (as is the case for nanorods), the LC molecules are properly aligned along nearly the entire length of the feature. This benefit holds true even if the local orientation of each nanoline varies along the length of the nanoline, i.e., even if the first derivative of the line is non-zero along the length of the line. FIG. 7B shows such an example where the local orientation (i.e., the tangent to the nanoline) 711 is different from the local orientation 713 at a different location along the nanoline. Such a nanoline can impart, to an optical beam passing through it, a spatially dependent phase response that varies along the length of the one nanoline. This is contrasted with a nanorod that does not have a continuously varying orientation along its length and thus can only impart a single valued phase shift on the optical beam at the location on the beam that overlaps in space with the nanorod.

Figure 7C:
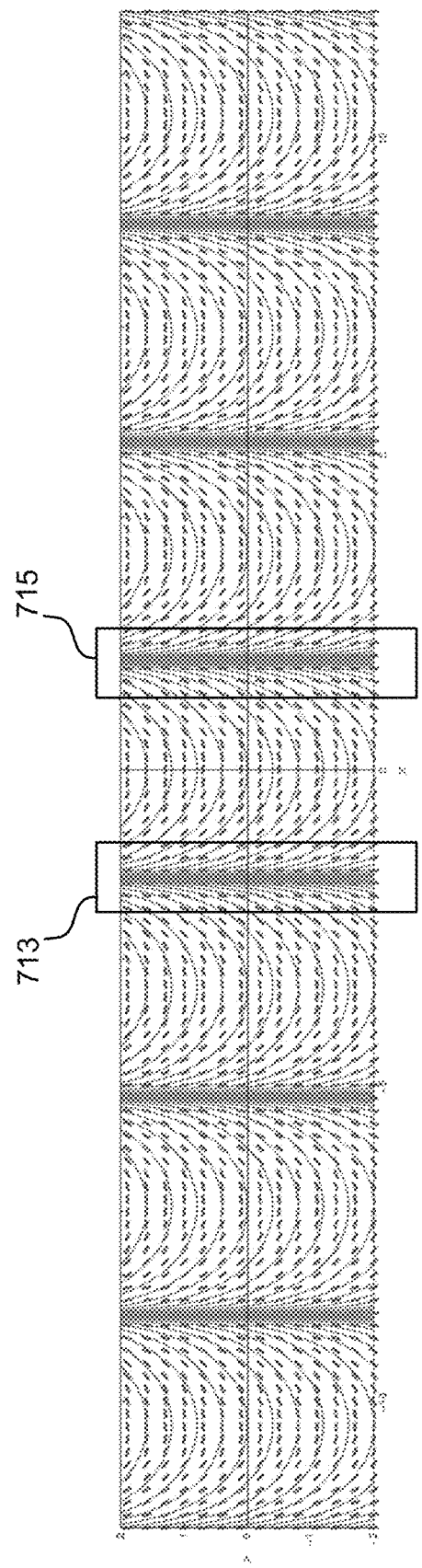

FIG. 7C shows a nanoline alignment layer, similar to alignment layer 701, overlaid on top of a nanorod pattern that can be used for a beam steering optical element, as describe above in reference to FIG. 6A. FIG. 7C shows that local orientation of each nanoline is substantially parallel to the orientation of each nanorod and thus, the LC molecules that align along the local surface direction of each nanoline can be similar to the LC molecule orientation that would result from a nanorod alignment layer. However, advantageously, the nanoline alignment layer will not suffer from the problems of nanorod layers whereby some of the LC molecules align with the local surface direction of each end of the nanorods. Accordingly, the nanoline alignment layer can provide for improved optical performance of the beam steering device.

While FIG. 7C shows the mathematically ideal pattern for a nanoline alignment layer, the manufactured pattern may include differences form the ideal case to account for feasibility of manufacturing. For example, FIG. 7A shows the nanoline pattern as it would be manufactured. Such a pattern deviates from the ideal pattern in the regions where many nanolines converge in the ideal pattern, e.g., in regions 713 and 715 of FIG. 7C. In the manufactured pattern shown in 7A, a single vertical nanoline is drawn to approximate the convergence region and the individual curved nanolines are terminated before they reach the vertical nanoline. According to certain embodiments, all the nanoline can terminate a fixed distance from the convergence region, e.g., a fixed distance from the vertical nanoline. According to certain embodiments, the termination distance can alternate, as shown in FIG. 7A, where every third curved nanoline, e.g., nanoline 719 is allowed to extend closer to the vertical nanoline than the two intervening nanolines, e.g., nanolines 721 and 723. In some embodiments, a set of rules can be implemented in the pattern-generating algorithm to keep the pattern density below a certain threshold and/or to keep the space between lines above a certain threshold value. Also, the termination of the line can be sharpened to avoid abrupt interruption and reduce the gap between the ideal and real pattern.

Figure 8A:
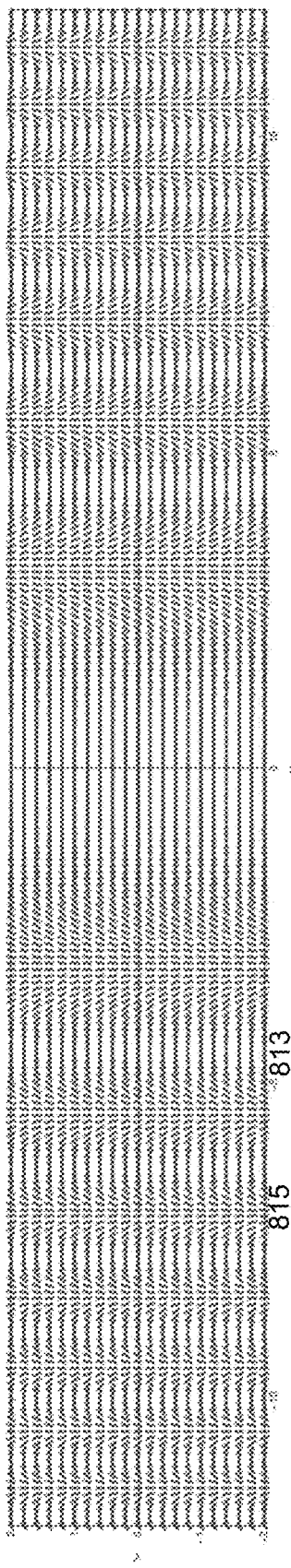
FIG. 8A-8D illustrate views of a nanopatterned alignment layer, according to certain embodiments.

FIG. 8A shows another example of a nanorod alignment pattern. More specifically, the nanorod alignment pattern shown in FIG. 8A can be used to produce an optical element that is a cylindrical lens, e.g., an optical element that focuses an optical beam in only one direction.
In this case, the orientation of the nanorods varies only along the x direction according to the function $$\theta(x) = \frac{\pi x^2}{2f\lambda} \tag{3}$$

where x is the x-position of the $i^{th}$ nanorod along any line having a fixed y-coordinate, e.g., (any horizontal line), f is focal distance, and λ is the wavelength of light for which the lens is designed.

Figure 8B:
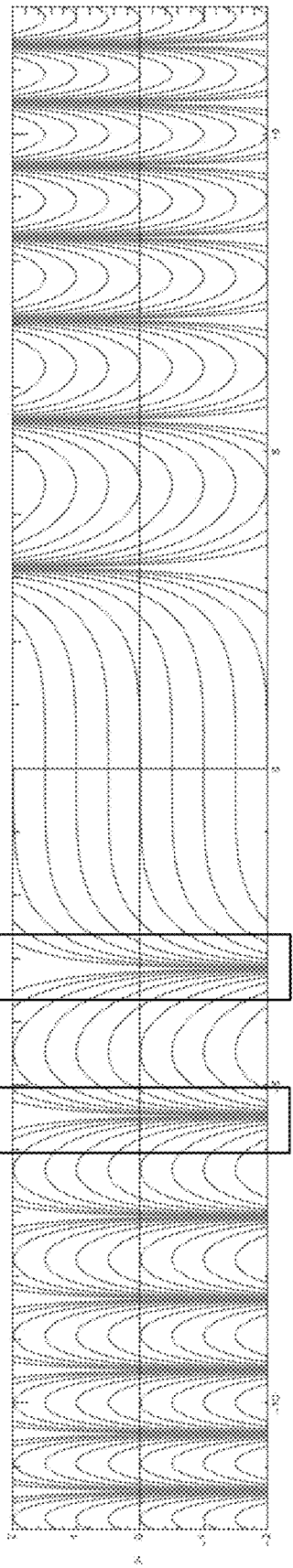
Figure 8C:
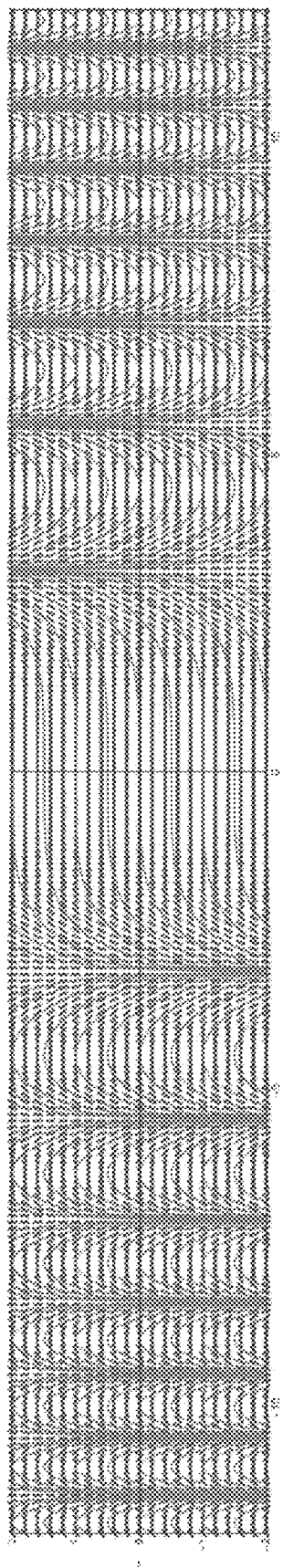

FIG. 8B shows a nanoline pattern having a set of nanolines whose local orientations approximate the nanorod orientations described in Eqn. (3) and shown in FIG. 8A. Each nanoline varies only in the x direction and is described by the closed form function $$g(x) = -\text{sign}[x]Re\left[\log\left|\cos\frac{\pi x^2}{2f\lambda}\right|\right] \tag{4}$$

Figure 8D:
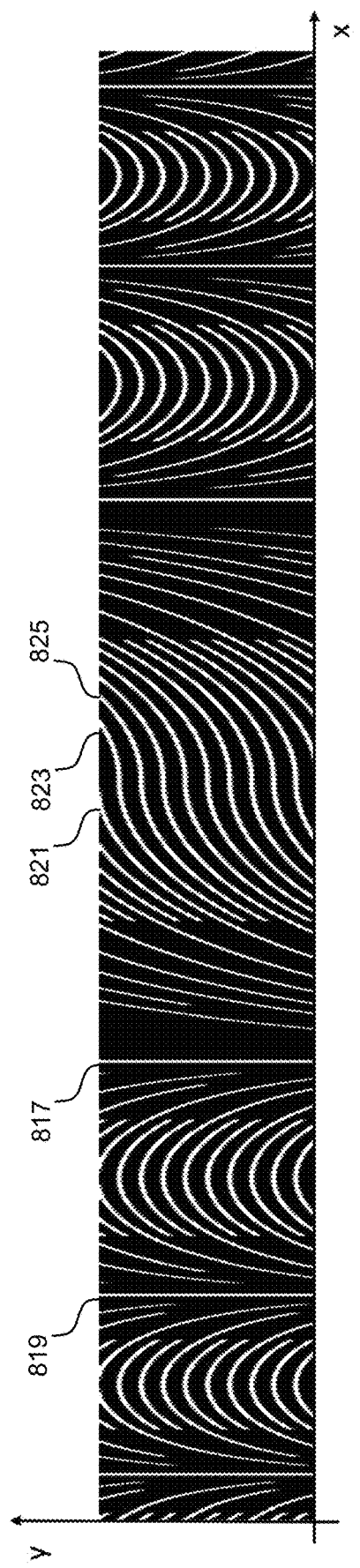

Similar to the discussion of the beam steering element above in reference to FIGS. 7A-7C, FIGS. 8B-8C show the mathematically ideal pattern for a nanoline alignment layer operating as a cylindrical lens. As before the manufactured pattern may include differences form the ideal case to account for feasibility of manufacturing, viz., the manufactured pattern can deviate from the ideal pattern in the regions where many nanolines converge in the ideal pattern, e.g., in regions 813 and 815 of FIG. 8B. FIG. 8D represents the unit cell of the manufactured pattern of a cylindrical lens. This cell can be repeated an arbitrary number of times vertically to extend the height of the lens. In the manufactured pattern shown in FIG. 8D, a single vertical nanoline is drawn to approximate the convergence region, e.g., vertical nanolines 819 and 817. The other curved nanolines terminate before they reach these vertical nanolines. As was the case for the pattern shown in FIG. 7A, according to certain embodiments, all the nanolines can terminate a fixed distance from the convergence region, e.g., a fixed distance from the vertical nanoline or the termination distance can alternate, as shown in FIG. 8D, where every third curved nanoline, e.g., nanoline 821 is allowed to extend closer to the vertical nanoline than the two intervening nanolines, e.g., nanolines 823 and 825. This is the typical result of a particular algorithm to limit pattern density. Lines that terminate sooner (i.e., shorter lines) will lower the pattern density closer to high density regions and allow adjacent lines to extend further until a threshold pattern density is reached again and even these lines are interrupted. This results in lines that break in a staggered pattern as can be seen in FIG. 8D.

While FIGS. 7-8 show examples of alignment layers where the nanolines vary only along x, some embodiments can employ nanoline patterns having significantly more complicated spatial dependence. For example, the local orientation of each nanoline can depend on both x and y (in contrast to Eqns. (2) and (4) that depend only on x). In general, the nanoline pattern for any alignment layer within any given layered optical element can be computed based on a desired two dimensional orientation function $\theta(x, y)$. In one example $\theta(x, y)$ may represent the equation of a lens.

For example, based on the known optical response of the optical element (e.g., assume that the element should be a 5 degree beam steering element for 800 nm light) one or more optical wave equations may be solved, e.g., the diffraction equations, Maxwell's equations or the like, and the required phase response of the optical element can be determined from first principles. Then, based on knowledge of how the LC molecules interact with the incoming light, e.g., as obtained by prior tests, the required orientation of the LC molecules over the 2 dimensional surface representing the alignment layer can be computed. It is this two dimensional array of LC orientation values that is then taken as the orientation function $\theta(x, y)$.

In another example a discretized form of $\theta(x_i, y_i)$ may already be known from, e.g., based on a template for a nanorod based nanoimprint alignment layer. In some cases, the $\theta(x_i, y_i)$ data may be used to determine an exact or approximate functional form for $\theta(x, y)$, e.g., through a numerical curve fitting routine. In yet other examples the exact form for the function $\theta(x, y)$ may be known in advance and can be solved analytically.

In any case, $\theta(x, y)$ can be used as the starting point to compute the set of nanolines. This is because the function $\theta(x, y)$ defines the slope of the desired continuous nanolines $g(x)$ at all points in the x-y plane. In other words, to find $g(x)$, a condition is imposed that the derivative of $g(x)$ for all x is the tangent of $\theta(x, y)$. Stated mathematically, this condition gives the following equation, which can be used to analytically derive $y=g(x)$:

$$\frac{d}{dx}g(x) = \tan[\theta(x, y)] \qquad (3)$$

For a given $\theta(x, y)$, Eqn. (3) may have closed form solutions or may need to be approximated using numerical methods in which case $\theta(x, y)$ can be discretized appropriately.

In general, the nanoline functions g need not have the same form over the entire (x,y) range of the alignment layer. For example, the nanoline functions can be approximately cubic for all y points but only over the x range of $x_1 \leq x \leq x_2$ but can be approximately parabolic over all y points but only over the x range of $x_0 \leq x < x_1$. e application of a vertical shift parameter.

Most generally, the functional form for g can change depending on the location of the function on the alignment layer, i.e., the form of the function can depend on the location of the line in the x-y plane. As used herein, the "location" of the function can be any (x,y) point that is in the domain and range of the function. Accordingly, the location of a nanoline corresponding g(x) to can be defined to be the (x,y) position of the beginning of the nanoline, of the midpoint of the nanoline, of the end of the nanoline, etc.

For the sake of simplicity, the discussion of the nanoline function $\theta(x)$ has been limited to functions of a single variable x. In such cases it is generally possible to analytically solve the differential equation reported above and obtain a solution $y=g(x)$ in open form. However, in cases where $\theta$ is function of both x and y, the differential equation reported above to derive the nanoline function $y=g(x)$ may not be solvable analytically and numeric methods may have to be implemented. Moreover, if an analytical solution is found, it may not be possible to separate its variables (x, y). To include these cases, we generally describe the function of the nanoline as $g(x, y)$ without departing from the scope of the present disclosure. One such example is the equation of a spherical lens:

$$\frac{d}{dx}g(x, y) = \tan\left[\frac{\pi}{\lambda}\left(f - \sqrt{x^2 + y^2 + f^2}\right)\right] \qquad (4)$$

Furthermore, a nanopatterned alignment layer that results from imprinting a set of nanolines described by nanoline functions g(x, y) can be periodic or non-periodic in one or more dimensions. As with the parabolic functions shown in FIG. 8, one or more groups of nanoline functions $g_i$ can be repeated over one or more intervals (in one or two dimensions) to form the alignment layer. The period p of these intervals, i.e., the length scale over which the pattern repeats, can be constant or can vary over the alignment layer according to a mathematical relationship. According to certain embodiments, h(x,y) can be a tridimensional function, such as z1=h(x,y), that we truncate using another similarly convoluted function z2=f(x,y) to derive g(x,y).

Figure 9:
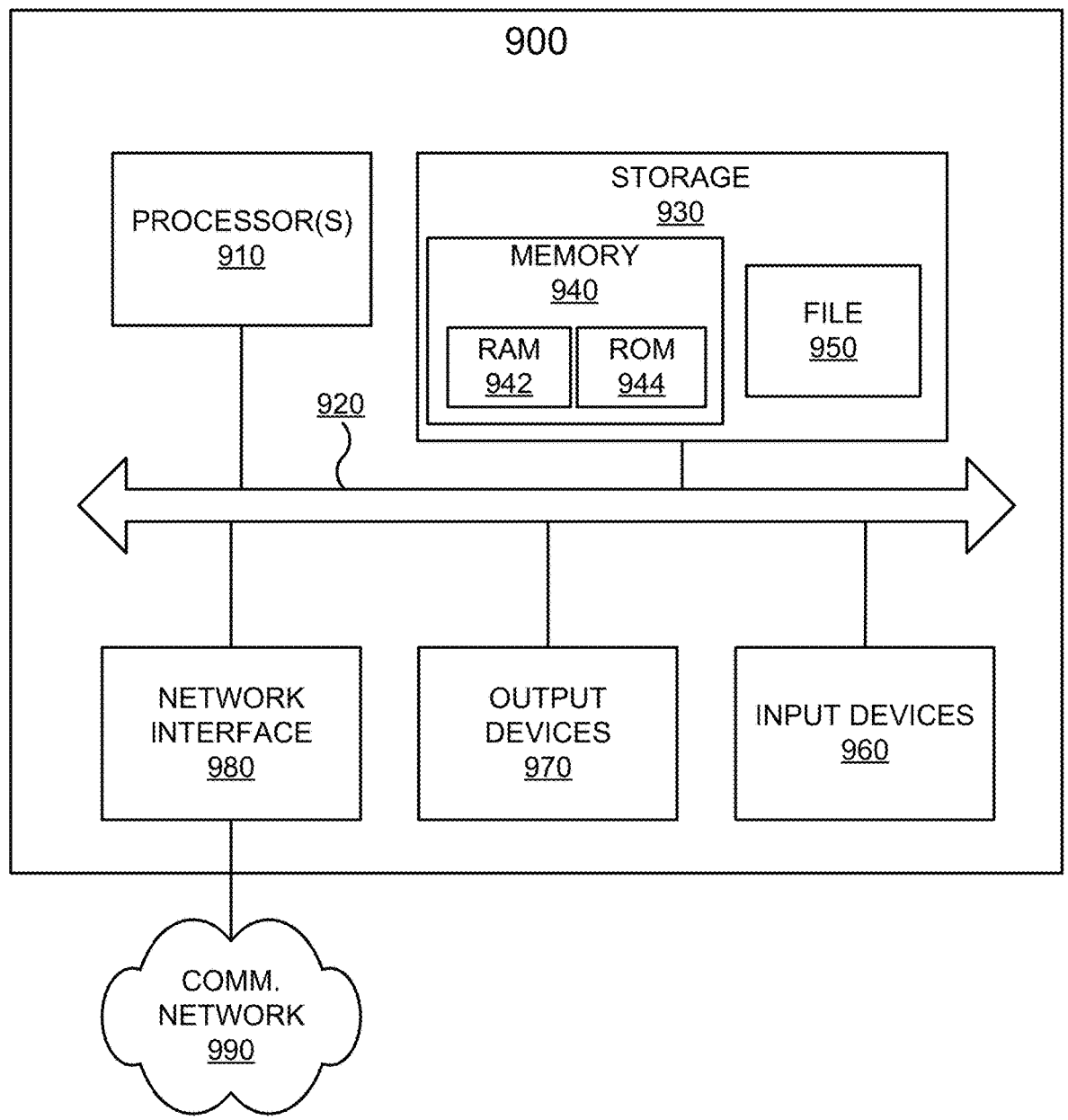
FIG. 9 illustrates an example of computer system 900, which may be used to implement certain embodiments described herein.

FIG. 9 illustrates an example of computer system 900, which may be used to implement certain embodiments described herein. For example, in some embodiments, computer system 900 may be one or more control units that are implemented within, e.g., an e-beam lithography system and/or a nanoimprint lithography system in accordance with one or more embodiments. In some embodiments, the computer system 900 can be employed to generate nanoline pattern, e.g., by employing software that can produce numerical solutions to Eqns. (3)-(4). In this example, computer system 900 includes one or more processors 910, a bus 920, a storage system 930, one or more input devices 960, one or more output devices 970, a network interface 980, and the like.

In the present example, input device(s) 960 may include a computer mouse, a trackball, a track pad, a joystick, a wireless remote controller, a drawing tablet, a voice command system, an eye tracking system, and the like. Input device(s) 960 may allow a user to select objects, icons, text, and the like that appear on an output device 970 (e.g., a monitor or display device) via a command such as a click of a button or the like. Output devices 970 may include, without limitation, a display device (e.g., a monitor), a printer, light-emitting diodes (LEDs), speakers, and/or the like.

Examples of network interface 980 may include an Ethernet card, a modem (telephone, satellite, cable, ISDN), (asynchronous) digital subscriber line (DSL) unit, FireWire interface, universal serial bus (USB) interface, general purpose interface bus (GPIB), and the like. For example, network interface 980 may be coupled to a communication network 990, to a FireWire bus, or the like. In other embodiments, network interface 980 may be physically integrated on the motherboard of computer system 900, may be a software program, such as soft DSL, or the like.

Processor(s) 910 may include, without limitation, one or more general-purpose processors, one or more special-purpose processors (e.g., digital signal processing (DSP) chips, graphics acceleration processors, application-specific integrated circuits (ASICs), and/or the like), and/or other processing structures or means, which can be configured to perform one or more of the methods described herein.

Storage system 930 may include, without limitation, local and/or network accessible storage, and/or can include, without limitation, a disk drive, a drive array, an optical storage device, such as a compact disk read-only memory (CD-ROM) or digital versatile disk (DVD), a solid-state storage device, which may be configured to implement any appropriate data stores, including, without limitation, various file systems 950, database structures, and/or the like. Storage system 930 may include memory 940, such as a random access memory (RAM) 942, and/or a read-only memory (ROM) 944, which can be programmable, flash-updateable, and/or the like. An operating system may be stored in file systems 950, and may be loaded to RAM 942 when computer system 900 is booted. RAM 942 and the disk drive are examples of tangible media configured to store data including executable computer code, human readable code, photos, videos, maps, and other data collected by various entities, heat maps, or the like. In accordance with one or more embodiments, the storage 930 may include computer readable instructions that when executed cause the processor 910 to perform any of the method/process steps described herein. For example, the computer readable instructions can include one or more routines for numerically solving differential equations such as the differential equations described above in reference to Eqns. (1)-(4) so that the computer system 900 can be used to generate nanoline patterns such as those described above. Numerical routines can include finite difference methods, method of lines, finite element methods, gradient discretization methods, finite volume methods, spectral methods, meshfree methods, domain decomposition methods, multi-grid methods, Euler methods, backward Euler methods, first-order exponential integrator methods, linear multi-step methods (e.g. Runge-Kutta), or any other suitable method for numerically solving differential equations.

In various examples, computer system 900 may also include software that enables communications over a network using, for example, the HTTP, TCP/IP, RTP/RTSP protocols, and the like. In alternative embodiments, other communications software and protocols may also be used, such as IPX, UDP, or the like.

In the preceding description, for the purposes of explanation, specific details are set forth in order to provide a thorough understanding of examples of the disclosure. However, it should be apparent that various examples may be practiced without these specific details. For example, circuits, systems, networks, processes, and other components may be shown as components in block diagram form in order to not obscure the examples in unnecessary detail. In other instances, well-known circuits, processes, algorithms, structures, and techniques may have been shown without necessary detail in order to avoid obscuring the examples. The figures and description are not intended to be restrictive.

The description provides examples only, and is not intended to limit the scope, applicability, or configuration of the disclosure. Rather, the description of the examples provides those skilled in the art with an enabling description for implementing an example. It should be understood that various changes may be made in the function and arrangement of elements without departing from the spirit and scope of the disclosure as set forth in the appended claims.

Also, it is noted that individual examples may be described as a process which is depicted as a flowchart, a flow diagram, a data flow diagram, a structure diagram, or a block diagram. Although a flowchart may describe the operations as a sequential process, many of the operations may be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination may correspond to a return of the function to the calling function or the main function.

The term "machine-readable storage medium" or "computer-readable storage medium" includes, but is not limited to, portable or non-portable storage devices, optical storage devices, and various other mediums capable of storing, containing, or carrying instruction(s) and/or data. A machine-readable storage medium or computer-readable storage medium may include a non-transitory medium in which data may be stored and that does not include carrier waves and/or transitory electronic signals propagating wirelessly or over wired connections. Examples of a non-transitory medium may include, but are not limited to, a magnetic disk or tape, optical storage media such as compact disk (CD) or digital versatile disk (DVD), flash memory, memory or memory devices. A computer-program product may include code and/or machine-executable instructions that may represent a procedure, a function, a subprogram, a program, a routine, a subroutine, a module, a software package, a class, or any combination of instructions, data structures, or program statements. For example, according to some embodiments, the machine readable storage medium may include instructions that represent a procedure for determining a nanofeature pattern and for causing a lithography system to form such an alignment pattern in an alignment layer as described above.

Furthermore, examples may be implemented by hardware, software, firmware, middleware, microcode, hardware description languages, or any combination thereof. When implemented in software, firmware, middleware or microcode, the program code or code segments to perform the necessary tasks (e.g., a computer-program product) may be stored in a machine-readable medium. One or more processors may execute the software, firmware, middleware, microcode, the program code, or code segments to perform the necessary tasks.

Systems depicted in some of the figures may be provided in various configurations. In some embodiments, the systems may be configured as a distributed system where one or more components of the system are distributed across one or more networks such as in a cloud computing system.

Where components are described as being "configured to" perform certain operations, such configuration may be accomplished, for example, by designing electronic circuits or other hardware to perform the operation, by programming programmable electronic circuits (e.g., microprocessors, or other suitable electronic circuits) to perform the operation, or any combination thereof.

The terms and expressions that have been employed in this disclosure are used as terms of description and not of limitation, and there is no intention in the use of such terms and expressions of excluding any equivalents of the features shown and described or portions thereof. It is recognized, however, that various modifications are possible within the scope of the systems and methods claimed. Thus, it should be understood that, although certain concepts and techniques have been specifically disclosed, modification and variation of these concepts and techniques may be resorted to by those skilled in the art, and that such modifications and variations are considered to be within the scope of the systems and methods as defined by this disclosure.

Although specific embodiments have been described, various modifications, alterations, alternative constructions, and equivalents are possible. Embodiments are not restricted to operation within certain specific data processing environments, but are free to operate within a plurality of data processing environments. Additionally, although certain embodiments have been described using a particular series of transactions and steps, it should be apparent to those skilled in the art that this is not intended to be limiting. Although some flowcharts describe operations as a sequential process, many of the operations may be performed in parallel or concurrently. In addition, the order of the operations may be rearranged. A process may have additional steps not included in the figure. Various features and aspects of the above-described embodiments may be used individually or jointly.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented as a computer program product containing computer program code or instructions executable by one or more processors for performing any or all of the steps, operations, or processes described in this disclosure, where the computer program may be stored on a non-transitory computer readable medium. The various processes described herein may be implemented on the same processor or different processors in any combination.

Where devices, systems, components or modules are described as being configured to perform certain operations or functions, such configuration may be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes may communicate using a variety of techniques including but not limited to conventional techniques for inter-process communications, and different pairs of processes may use different techniques, or the same pair of processes may use different techniques at different times.

Specific details are given in this disclosure to provide a thorough understanding of the embodiments. However, embodiments may be practiced without these specific details. For example, well-known circuits, processes, algorithms, structures, and techniques have been shown without unnecessary detail in order to avoid obscuring the embodiments. This description provides example embodiments only, and is not intended to limit the scope, applicability, or configuration of other embodiments. Rather, the preceding description of the embodiments will provide those skilled in the art with an enabling description for implementing various embodiments. Various changes may be made in the function and arrangement of elements.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A layered optical element comprising:
   a substrate layer;
   an electrode layer disposed on the substrate layer;
   a liquid crystal (LC) layer comprising LC molecules; and
   a nanopatterned alignment layer in physical contact with the LC layer and disposed on a surface of either the substrate layer or the electrode layer,
      wherein the nanopatterned alignment layer comprises a plurality of nanostructures,
      wherein the plurality of nanostructures comprises, on a plane parallel to the substrate layer, a plurality of nanolines, and wherein, for each nanoline of a subset of the plurality of nanolines,
the nanoline has a curved shape on the plane, the curved shape characterized by a varying local orientation direction along a length of the nanoline on the plane, and
the nanoline is configured to orient the LC molecules parallel to the varying local orientation direction of the nanoline along the length of the nanoline when no electric field is applied to the LC layer.

2. The layered optical element of claim 1, wherein the plurality of nanostructures further comprises at least one nanoline having a non-varying local orientation direction that does not vary along a length of the at least one nanoline.

3. The layered optical element of claim 1, wherein the varying local orientation direction of each nanoline in the subset causes the layered optical element to impart a spatially dependent phase response to an optical beam that passes through the layered optical element.

4. The layered optical element of claim 1, wherein nanolines in the subset have a continuous slope along their entire length.

5. The layered optical element of claim 1, wherein a first phase response of the layered optical element at a first position along a length of at least one nanoline in the subset is different from a second phase response of the layered optical element at a second position along the length of the at least one nanoline in the subset.

6. The layered optical element of claim 1, wherein a length-to-width ratio of at least one nanoline in the subset is greater than or equal to 2.

7. The layered optical element of claim 1, wherein a width of each nanoline in the subset, as measured along a direction that is perpendicular to the varying local orientation direction, is smaller than a wavelength of light to be passed through the layered optical element.

8. The layered optical element of claim 1, wherein at least one of a shape or the length of a nanoline in the subset depends on an (x,y) position of the nanoline on the nanopatterned alignment layer.

9. The layered optical element of claim 1, wherein each nanoline in the subset is described by a continuous mathematical expression g(x).

10. The layered optical element of claim 9, wherein nanolines not in the subset are described by a different continuous mathematical expression $g_2(x)$.

11. The layered optical element of claim 9, wherein g(x) is derived from a function θ(x,y) that defines an orientation function for a plurality of nanorods, where θ(x,y) is an angle between a nanorod located at an (x,y) position and a horizontal axis in an x-y plane defined by a substrate surface.

12. The layered optical element of claim 11, wherein g(x) satisfies a differential equation given by $$\frac{d}{dx}g(x) = \theta(x, y)$$

along each nanoline in the subset.

13. The layered optical element of claim 1, wherein,
the electrode layer is disposed on a first surface of the substrate layer;
the nanopatterned alignment layer is disposed on a second surface of the substrate layer; and
the first surface and second surfaces of the substrate layer oppose each other.

14. The layered optical element of claim 1, further comprising:
an opposing substrate layer; and
an opposing electrode layer,
wherein the opposing substrate layer opposes the nanopatterned alignment layer, and the LC layer is disposed between the opposing substrate layer and the nanopatterned alignment layer.

15. The layered optical element of claim 14 further comprising an opposing nanopatterned alignment layer in physical contact with the LC layer and disposed on either the opposing substrate layer or the opposing electrode layer, wherein the LC layer is disposed between the nanopatterned alignment layer and the opposing nanopatterned alignment layer.

16. A nanoimprint pattern mold comprising:
a mold substrate; and
a nanopattern layer disposed on the mold substrate, the nanopattern layer comprising a nanopattern on a surface of the nanopattern layer,
wherein the nanopattern comprises a plurality of nanostructures disposed across the surface of the nanopattern layer,
wherein the plurality of nanostructures comprises a plurality of nanolines, and
wherein each nanoline in a subset of the plurality of nanolines has a curved shape characterized by a local orientation direction varying along a length of the nanoline on the surface of the nanopattern layer such that a corresponding imprinted nanoline imprinted using the nanoimprint pattern mold is curved and is configured to orient liquid crystal molecules in a direction parallel to a local orientation direction of the imprinted nanoline along a length of the imprinted nanoline.

17. The nanoimprint pattern mold of claim 16, wherein each nanoline in the subset is described by a continuous mathematical expression $g_1(x)$.

18. The nanoimprint pattern mold of claim 17, wherein nanolines not in the subset are described by a different continuous mathematical expression $g_2(x)$.

19. The nanoimprint pattern mold of claim 17, wherein $g_1(x)$ is derived from a function θ(x,y) that defines an orientation function for a plurality of nanorods, where θ(x,y) is an angle between a nanorod located at an (x,y) position and a horizontal axis in an x-y plane defined by a substrate surface.

20. The nanoimprint pattern mold of claim 19, wherein $g_1(x)$ satisfies a differential equation given by $$\frac{d}{dx}g_1(x) = \theta(x, y)$$

along each nanoline in the subset.

* * * * *